United States Patent
Davare et al.

(10) Patent No.: US 10,504,813 B2
(45) Date of Patent: Dec. 10, 2019

(54) HEAT SINK ASSEMBLIES FOR SURFACE MOUNTED DEVICES

(71) Applicant: Astec International Limited, Kwun Tong (HK)

(72) Inventors: Rahul Vinaykumar Davare, Eden Prairie, MN (US); Robert Henry Kippley, Eagan, MN (US); Kwong Kei Chin, Fremont, CA (US)

(73) Assignee: Astec International Limited, Kwun Tong, Kowloon (HK)

( * ) Notice: Subject to any disclaimer, the term of this patent is extended or adjusted under 35 U.S.C. 154(b) by 0 days.

(21) Appl. No.: 15/282,540

(22) Filed: Sep. 30, 2016

(65) Prior Publication Data

US 2018/0098414 A1 Apr. 5, 2018

(51) Int. Cl.
*H01L 23/367* (2006.01)
*H05K 1/02* (2006.01)
*H05K 3/30* (2006.01)
*H05K 1/18* (2006.01)

(52) U.S. Cl.
CPC ......... *H01L 23/367* (2013.01); *H05K 1/0206* (2013.01); *H05K 3/303* (2013.01); *H05K 1/181* (2013.01); *H05K 2201/066* (2013.01)

(58) Field of Classification Search
CPC ...... H01L 23/367; H05K 1/0203–0204; H05K 7/205
See application file for complete search history.

(56) References Cited

U.S. PATENT DOCUMENTS 4,535,385 A * 8/1985 August .................. H01L 23/36
257/E23.101
4,628,407 A * 12/1986 August .................. H01L 23/36
257/E23.101
(Continued)

FOREIGN PATENT DOCUMENTS

DE 102007029422 A1 * 1/2009 ........... H05K 1/0206
EP 0085622 A2 * 8/1983 ............. H01L 23/36
(Continued)

OTHER PUBLICATIONS

Parker Chromerics, Thermal Management Products & Custom Solutions Catalog, Therm Cat 1001 EN Oct. 2007 (Year: 2007).*

*Primary Examiner* — Robert J Hoffberg
(74) *Attorney, Agent, or Firm* — Harness, Dickey & Pierce, P.L.C.

(57) ABSTRACT

According to some aspects of the present disclosure, heat sink assemblies are disclosed. Example heat sink assemblies include a printed circuit board having a first side and a second side. The printed circuit board defines an opening extending from the first side to the second side. The heat sink assembly also includes a heat sink coupled to the first side of the printed circuit board. The heat sink includes a protrusion extending through the through opening of the printed circuit board. The heat sink assembly further includes a surface mounted device coupled to the second side of the printed circuit board. The surface mounted device is in thermal contact with the protrusion of the heat sink to transfer heat from the surface mounted device to the heat sink. Example methods of manufacturing heat sink assemblies are also disclosed.

13 Claims, 5 Drawing Sheets

(56) References Cited

U.S. PATENT DOCUMENTS

| | | | | |
|---|---|---|---|---|
| 5,014,904 A | * | 5/1991 | Morton | H05K 1/0204 228/123.1 |
| 5,095,404 A | * | 3/1992 | Chao | H01L 23/4006 165/104.33 |
| 5,172,301 A | * | 12/1992 | Schneider | H01L 23/367 165/185 |
| 5,617,294 A | * | 4/1997 | Watson | H01L 21/4882 174/16.3 |
| 5,646,826 A | * | 7/1997 | Katchmar | H01L 23/4006 165/185 |
| 5,747,876 A | * | 5/1998 | Majumdar | H01L 23/24 257/687 |
| 5,779,134 A | | 7/1998 | Watson et al. | |
| 5,784,256 A | * | 7/1998 | Nakamura | G06F 1/1616 257/712 |
| 5,812,375 A | * | 9/1998 | Casperson | H05K 1/0204 165/80.3 |
| 5,825,625 A | * | 10/1998 | Esterberg | H01L 23/3677 361/719 |
| 5,856,911 A | * | 1/1999 | Riley | G06F 1/203 174/16.3 |
| 5,920,458 A | | 7/1999 | Azar | |
| 6,018,193 A | * | 1/2000 | Rubens | H01L 23/3677 257/720 |
| 6,130,477 A | * | 10/2000 | Chen | H01L 23/34 257/669 |
| 6,205,028 B1 | * | 3/2001 | Matsumura | H05K 1/0201 174/252 |
| 6,411,516 B1 | * | 6/2002 | Palumbo | H01L 23/3677 174/252 |
| 6,580,611 B1 | * | 6/2003 | Vandentop | H01L 23/367 165/185 |
| 6,625,028 B1 | * | 9/2003 | Dove | H01L 23/13 165/185 |
| 6,809,931 B2 | * | 10/2004 | Dove | H01L 23/13 165/185 |
| 6,867,492 B2 | * | 3/2005 | Auburger | H01L 23/3677 257/675 |
| 6,922,339 B2 | * | 7/2005 | Nakamura | H01L 23/3677 165/185 |
| 6,999,318 B2 | * | 2/2006 | Newby | F21K 9/00 257/706 |
| 7,149,088 B2 | * | 12/2006 | Lin | H05K 7/209 361/704 |
| 7,151,229 B2 | * | 12/2006 | Mueller | H01L 23/3677 174/260 |
| 7,388,750 B2 | * | 6/2008 | Kim | H05K 7/20963 165/185 |
| 7,425,762 B2 | * | 9/2008 | Hasebe | H01L 23/142 257/707 |
| 7,552,530 B2 | * | 6/2009 | Mueller | H01L 23/3677 29/825 |
| 7,561,436 B2 | * | 7/2009 | Brandenburg | H01L 23/36 257/712 |
| 7,690,817 B2 | * | 4/2010 | Sanpei | H05K 1/0203 362/249.02 |
| 7,782,621 B2 | * | 8/2010 | Matsushiba | H01L 23/13 165/185 |
| 7,934,856 B2 | * | 5/2011 | Sanpei | H05K 1/0203 362/218 |
| 7,982,307 B2 | * | 7/2011 | Amin | H01L 23/13 257/675 |
| 7,983,048 B2 | * | 7/2011 | Sasaki | H01L 23/3677 165/104.33 |
| 8,030,661 B2 | * | 10/2011 | Sekimoto | H01L 23/647 257/691 |
| 8,164,182 B2 | * | 4/2012 | Ong | H01L 23/3128 257/675 |
| 8,167,456 B2 | * | 5/2012 | Sanpei | H05K 1/0203 362/249.02 |
| 8,278,559 B2 | * | 10/2012 | Loiselet | H01L 23/433 174/252 |
| 8,398,267 B2 | * | 3/2013 | Sanpei | H05K 1/0203 362/249.02 |
| 8,927,872 B2 | * | 1/2015 | Zhang | H01L 23/3677 174/252 |
| 9,059,127 B1 | * | 6/2015 | Lamorey | H01L 23/5226 |
| 9,091,421 B2 | * | 7/2015 | Kim | H05K 1/0203 |
| 9,153,760 B2 | * | 10/2015 | Bi | H01L 33/64 |
| 9,190,399 B2 | * | 11/2015 | Lamorey | H01L 25/18 |
| 9,763,317 B2 | * | 9/2017 | Mass | H05K 1/0204 |
| 10,076,059 B2 | * | 9/2018 | Kim | H05K 1/0204 |
| 10,141,182 B1 | * | 11/2018 | Molla | H01L 21/02109 |
| 2006/0061969 A1 | * | 3/2006 | Nilson | H05K 1/0204 361/704 |
| 2006/0250270 A1 | * | 11/2006 | Tangen | G03B 21/16 340/815.45 |
| 2008/0198557 A1 | * | 8/2008 | Lim | H01L 23/3675 361/719 |
| 2010/0288536 A1 | * | 11/2010 | Chiang | H01L 23/3677 174/252 |
| 2012/0326292 A1 | * | 12/2012 | Ohashi | H01L 23/3677 257/690 |
| 2013/0170136 A1 | * | 7/2013 | Roby | H05K 7/205 361/692 |
| 2018/0132353 A1 | * | 5/2018 | Predon | H05K 7/20545 |

FOREIGN PATENT DOCUMENTS

| | | | |
|---|---|---|---|
| EP | 0907307 A1 | 4/1999 | |
| WO | WO-2018145931 A1 | * 8/2018 | H05K 1/021 |

* cited by examiner

HEAT SINK ASSEMBLIES FOR SURFACE MOUNTED DEVICES

FIELD

The present disclosure relates to heat sink assemblies for surface mounted devices.

BACKGROUND

This section provides background information related to the present disclosure which is not necessarily prior art.

Surface mount devices are usually coupled to printed circuit boards. The devices often generate heat during operation that needs to be dissipated away from the surface mount device to inhibit overheating of the device. Generally, the surface mount devices include a heat dissipating terminal mounted directly on the printed circuit board.

SUMMARY

This section provides a general summary of the disclosure, and is not a comprehensive disclosure of its full scope or all of its features.

According to one aspect of the present disclosure, a heat sink assembly includes a printed circuit board having a first side and a second side opposite the first side. The printed circuit board defines an opening extending from the first side of the printed circuit board to the second side of the printed circuit board. The assembly also includes a heat sink coupled to the first side of the printed circuit board. The heat sink includes a protrusion that extends through the opening defined in the printed circuit board. The assembly also includes a surface mount device coupled to the second side of the printed circuit board. The surface mount device is in thermal contact with the protrusion of the heat sink to facilitate heat transfer from the surface mount device to the heat sink.

According to another aspect of the present disclosure, a method of manufacturing a heat sink assembly is disclosed. The method includes coupling a heat sink to a first side of a printed circuit board. The printed circuit board has an opening, and the protrusion is positioned in the opening. The opening is defined between the first side of the printed circuit board and a second side of the printed circuit board opposite the first side. The method also includes coupling a surface mount device to the second side of the printed circuit board and/or the protrusion to transfer heat from the surface mount device to the heat sink.

Further aspects and areas of applicability will become apparent from the description provided herein. It should be understood that various aspects and features of this disclosure may be implemented individually or in combination with one or more other aspects or features. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding features throughout the several views of the drawings.

DETAILED DESCRIPTION

Figure 1:
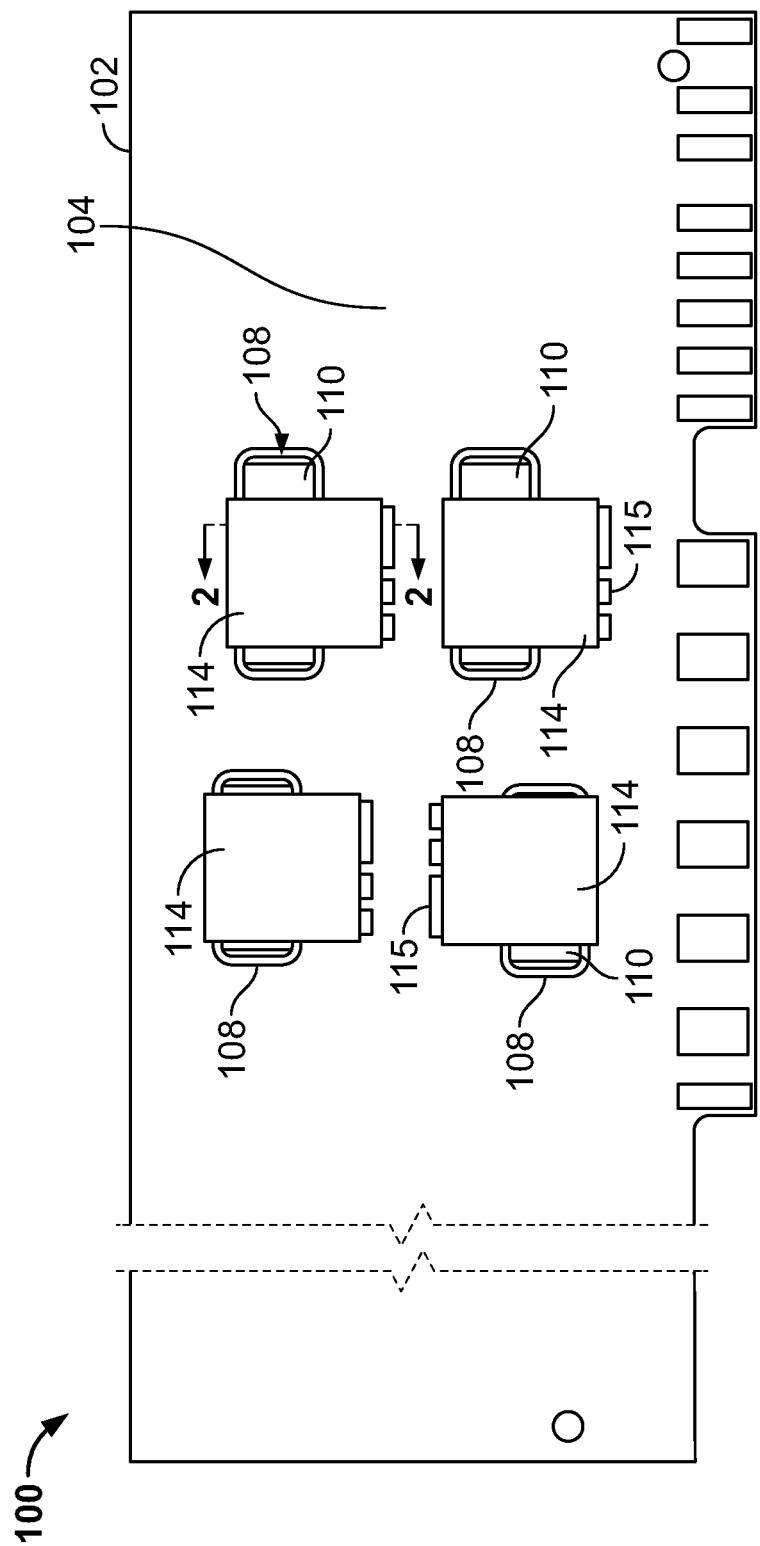
FIG. 1 is a top view of a heat sink assembly, according to one example embodiment of the present disclosure.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Figure 2:
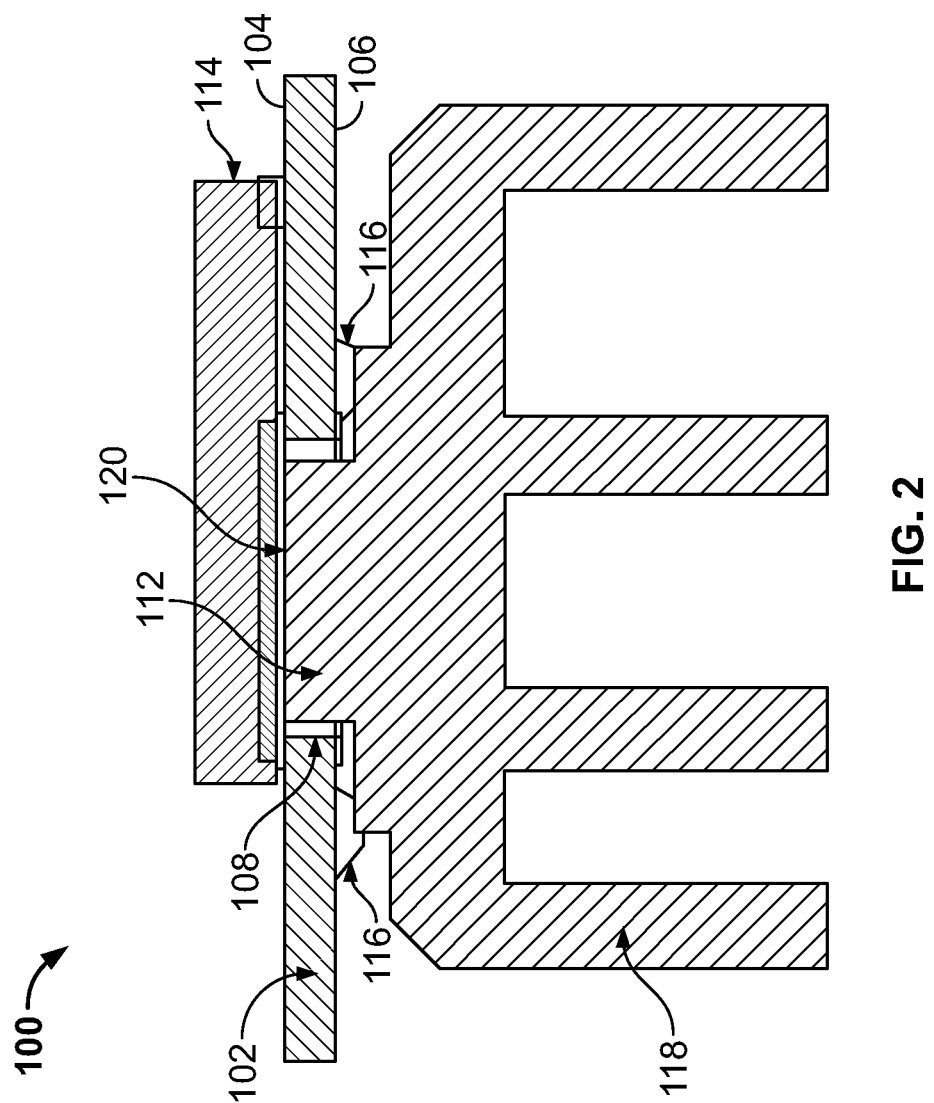
FIG. 2 is a side sectional view of the heat sink assembly of FIG.
Figure 3:
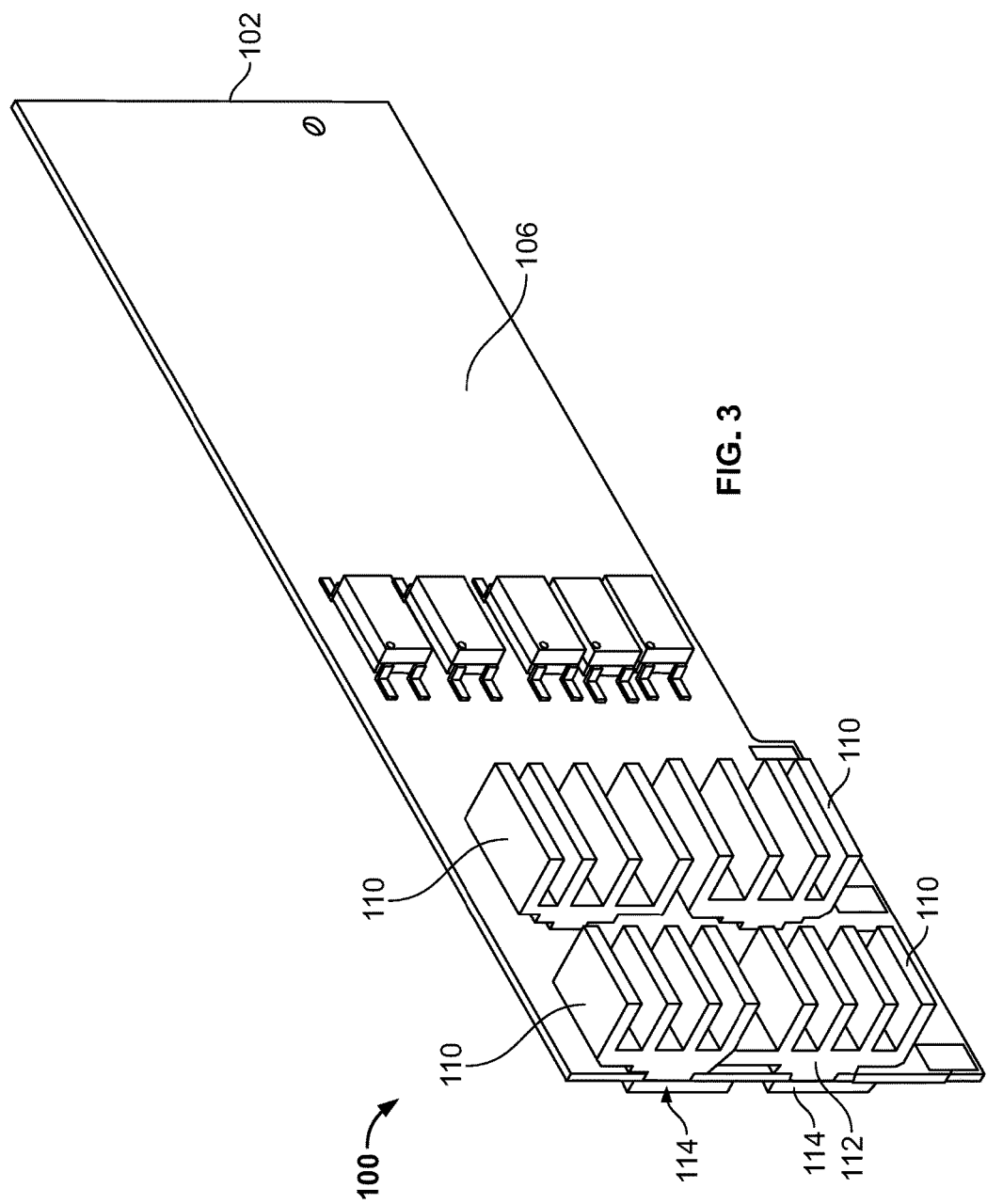
FIG. 3 is a bottom perspective view of the heat sink assembly of FIG. 2.

A heat sink assembly according to one example embodiment of the present disclosure is illustrated in FIGS. 1-3 and indicated generally by reference number 100. As shown in FIGS. 1-3, the heat sink assembly 100 includes a printed circuit board (PCB) 102 having a top side 104 and a bottom side 106. The printed circuit board 102 defines an opening 108 (e.g., through hole, etc.) extending from the top side 104 to the bottom side 106.

A heat sink 110 is coupled to the bottom side 106 of the printed circuit board 102. The heat sink 110 includes a protrusion 112. The protrusion 112 extends through the opening 108 defined in the printed circuit board 102 when the heat sink 110 is coupled to the printed circuit board 102.

A surface mount device 114 is coupled to the top side 104 of the printed circuit board. For example, the surface mount device 114 may be coupled approximately flush with the top side 104 of the printed circuit board 102 (e.g., a footprint of the surface mount device may be substantially coplanar with the top side 104 of the printed circuit board 102, etc.). The surface mount device 114 is in thermal contact with the protrusion 112 of the heat sink 110 when the surface mount device is coupled to the printed circuit board 102. This facilitates heat transfer from the surface mount device 114 to the heat sink 110. The surface mount device 114 is also coupled to the protrusion 112 of the heat sink 110. In some embodiments, the surface mount device 114 may be coupled to only the protrusion 112 and may not be coupled to the top side 104 of the printed circuit board 102.

Accordingly, the heat sink 110 may be in thermal contact with the surface mount device 114 (e.g., via physical contact, via a thermally conductive film disposed between the heat sink 110 and the surface mount device 114, via a thermally conductive paste disposed between the heat sink 110 and the surface mount device 114, etc.). The heat sink 110 may be in thermal contact with the surface mount device 114 though the opening 108 defined in the printed circuit board 102, while also allowing terminal(s) 115 of the surface mount device 114 to be connected to a circuit (not shown) of the printed circuit board 102.

As shown in FIG. 1, the surface mount device 114 includes multiple terminals 115 coupled to the top side 106 of the printed circuit board 102. The terminals 115 may be electrically coupled to circuits(s) of the printed circuit board 102 (not shown) when the surface mount device 114 is mounted flush with the top side 104 of the printed circuit board 102. Although FIG. 1 illustrates terminals 115 only on a bottom side of the surface mount device 114, in other embodiments a surface mount device may include terminals on a top side of the surface mount device, may include terminals on a top side and a bottom side of the surface mount device, etc.

The terminals 115 may include any suitable leads, contact pads, etc. The terminals 115 may be under a bottom surface of the surface mount device 114 (e.g., so the terminals 115 are flush with the bottom surface of the surface mount 114), the terminals 115 may extend from a side of the bottom surface of the surface mount device 115, etc.

The terminals 115 may provide electrical and/or thermal coupling between the surface mound device 114 and the protrusion 112, a circuit of the printed circuit board 102, etc.

One or more of the terminals 115 may be heat dissipating terminal(s) of the surface mount device 114 that is coupled to the protrusion 112 of the heat sink 110. This may provide effective heat transfer from the surface mount device 114 to the heat sink 110, thereby reducing (or eliminating) the need to use a highly thermally conductive PCB substrate, plated through vias in the PCB, etc. However, it should be apparent that thermally conductive PCBs, plated through vias, etc. may also be used in the heat sink assembly without departing from the scope of the present disclosure.

The opening 108 may be sized appropriately to allow the protrusion 112 of the heat sink 110 to extend through the opening 108 (e.g., the size of the opening 108 may correspond to a perimeter of the protrusion 112). In some embodiments, the protrusion 112 may have a surface area that is substantially the same size as the opening 108 so the protrusion 112 occupies substantially all of the space of the opening 108 (e.g., the protrusion may be considered as embedded in the printed circuit board 102).

The opening 108 may be smaller than a perimeter of the heat sink 110. For example, the bottom side 106 of the printed circuit board 102 may extend over portion(s) of the heat sink 110 other than the protrusion 112, such that portion(s) of the heat sink 110 can be coupled to the bottom side 106 of the printed circuit board 102 adjacent the opening 108.

In some embodiments, the opening 108 may be smaller than a footprint of the surface mount device 114 (e.g., a bottom perimeter of the surface mount device 114, a surface area of a bottom surface of the surface mount device, etc.), thereby allowing the surface mount device to be coupled to the top side 104 of the printed circuit board 102 adjacent the opening 102.

In other embodiments, the opening 108 may be larger than a footprint of the surface mount device 114, thereby allowing different package sizes of the surface mount device 114 to be used. For example, if the opening 108 is at least as large as the largest package size of the surface mount devices to be used, the opening 108 may be able to accommodate the full range of package sizes. This may allow each package size in the range to have an increased area of contact with the protrusion 112 of the heat sink 110, while having a reduced (or zero) area of contact between the surface mount device 114 and the printed circuit board 102.

As shown in FIG. 1, portions of the opening 108 extend beyond the footprint of the surface mount device 114. In this case, portions of the protrusion 112 extend beyond the footprint of the surface mount device 114. As should be apparent, other embodiments may include an opening size that corresponds to the footprint of the surface mount device 114, an opening size that is smaller than the footprint of the surface mount device 114, etc.

In some embodiments, the opening 108 may be a plated through opening. For example, the opening 108 may include a layer of thermally conductive material disposed around the wall(s) of the opening 108 to increase heat transfer through the opening 108 from the surface mount device 114 to the heat sink 110, to protect the printed circuit board 102 from heat transferred through the opening 108, etc. Example plating materials include, but are not limited to, copper, aluminum, etc. The thermally conductive material may also be electrically conductive.

The protrusion 112 may have a substantially flat top surface. Accordingly, the top surface of the protrusion 112 may be substantially coplanar with the top side 104 of the printed circuit board 102 when the heat sink 110 is coupled to the printed circuit board 102. This may provide a smooth, flat, etc. surface for applying the surface mount device 114 to the top side of the printed circuit board 102 and/or the top surface of the protrusion 112.

A height (i.e., thickness) of the protrusion 112 may correspond to a thickness of the printed circuit board 102. In some embodiments, the height of the protrusion 112 may be substantially similar to the thickness of the printed circuit board 102. For example, if a thickness of the printed circuit board 102 is about one millimeter, a height of the protrusion 112 may also be about one millimeter. In that case, when portions of the heat sink 110 adjacent the protrusion 112 are placed in contact with the bottom side 106 of the printed circuit board 102, the top surface of the protrusion 112 may be aligned with the top side 104 of the printed circuit board 102.

In some embodiments, the height of the heat sink protrusion 112 may be greater than the thickness of the printed circuit board 102. This may accommodate slight variations (e.g., tolerances) in protrusion thickness and printed circuit board thickness during manufacturing, etc. For example, if the protrusion thickness is slightly greater than the printed circuit board thickness, the protrusion 112 can be inserted through the opening 108 until the top surface of the protrusion 112 is aligned with the top side 104 of the printed circuit board 102. This may leave a gap between the bottom side 106 of the printed circuit board 102 and portions of the heat sink 110 adjacent the protrusion 112. This gap can be filled with a suitable coupling material.

The heat sink 110 may be coupled to the bottom side 106 of the printed circuit board 102 using any suitable coupling material, including but not limited to solder, glue, other adhesives, etc. As shown in FIG. 2, glue dots 116 are disposed between the bottom side 106 of the printed circuit board 102 and portions of the heat sink 110 adjacent the protrusion 112, thereby coupling the heat sink 110 to the printed circuit board 102. It should be apparent that other embodiments may use other suitable coupling materials between the printed circuit board 102 and the heat sink 110.

The surface mount device 114 may be any suitable electronic device capable of being coupled to the printed circuit board 102 and/or the protrusion 112. For example, the surface mount device 114 may comprise a microprocessor, microcontroller, integrated circuit chip, etc. The surface mount device 114 may generate heat during operation of the surface mount device 114.

The surface mount device 114 may have a substantially flat bottom surface (e.g., footprint) that allows for coupling to a flat surface of the printed circuit board 102. The surface mount device 114 may be mounted flush with the top side 104 of the printed circuit board 102 and/or the protrusion 112.

The surface mount device 114 can be coupled to the printed circuit board using any suitable coupling material, including solder material, glue material, other adhesive material, etc. As shown in FIG. 2, a solder material 120 is disposed between the surface mount device 114 and both the printed circuit board 102 and the top surface of the protrusion 112.

The heat sink 110 may employ any suitable heat sink construction suitable for transferring heat away from the surface mount device 114. As shown in FIGS. 1-3, the heat sink 110 includes multiple fins 118 extending away from the printed circuit board 102. The multiple fins 118 can transfer heat away from the surface mount device 114, and may have enhanced heat dissipation where air is passed over the multiple fins (e.g., by a fan, etc.). The heat sink 110 may include any thermally conductive material suitable for heat dissipation, including but not limited to copper, aluminum, etc.

In the example of FIGS. 1 and 3, the printed circuit board 102 defines multiple openings 108. The assembly 100 includes multiple heat sinks 110 and multiple surface mount devices 114. Each heat sink 110 has a protrusion 112 extending through a corresponding one of the openings 108, and each surface mount device 114 is in thermal contact with a corresponding one of the heat sink protrusions 112. As should be apparent, other heat sink assemblies may include more or less openings 108, heat sinks 110, and surface mount devices 114, other arrangements of the openings 108 in the printed circuit board, etc.

Although FIGS. 1-3 are described herein by referring to a top side 104 and a bottom side 106 of the printed circuit board 102, it should be apparent that top and bottom are for purposes of illustration only, and the opposing sides of the printed circuit board 102 may be oriented in different directions. For example, the heat sink 110 may be coupled to a top side, to a right side, a left side, a front side, a back side, etc. depending on the orientation of the printed circuit board. Similarly, the surface mount device 114 may be coupled to a respective side of the printed circuit board 102 in any suitable orientation.

Figure 4:
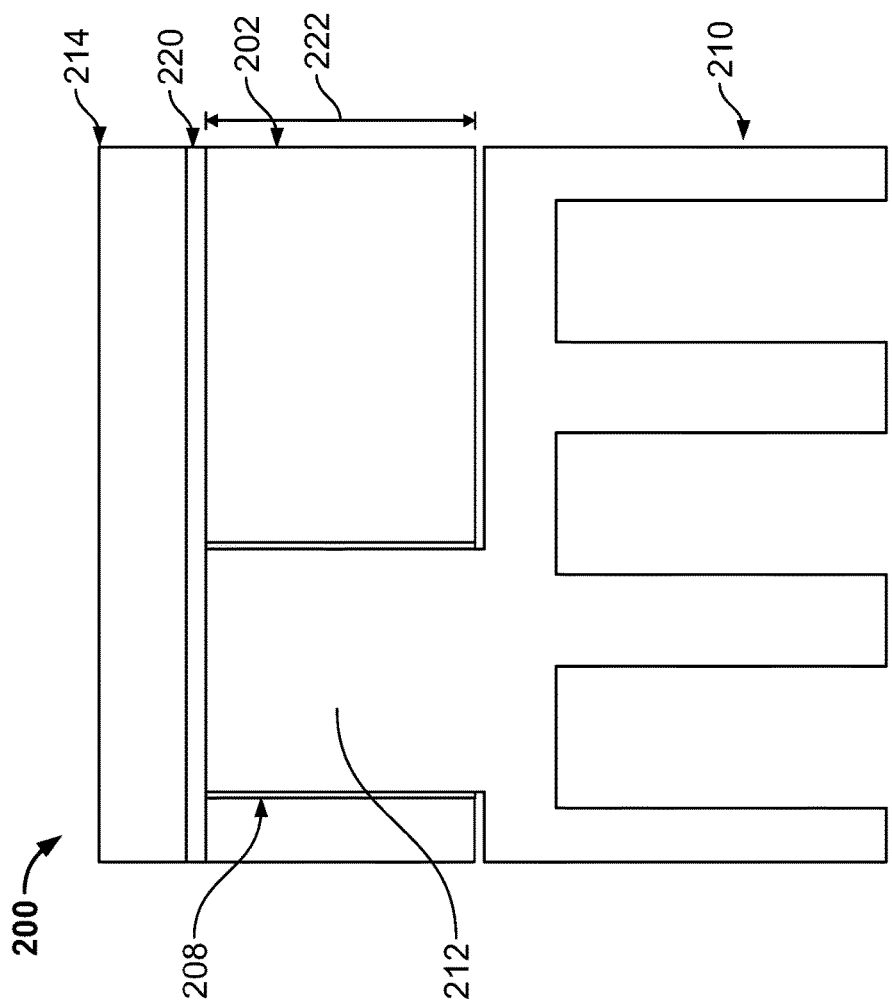
FIG. 4 is a side sectional view of a heat sink assembly according to another example embodiment of the present disclosure.

FIG. 4 illustrates a heat sink assembly 200 according to another example embodiment of the present disclosure. Similar to the heat sink assembly 100 of FIGS. 1-4, the heat sink assembly 200 includes a heat sink 210 having a protrusion 212 that extends through an opening 208 defined in a printed circuit board 202.

A surface mount device 214 is coupled to a top side of the printed circuit board 202 via solder 220. The surface mount device 214 is in thermal contact with the protrusion 212 of the heat sink 210 to dissipate heat from the surface mount device 214 to the heat sink 210.

As shown in FIG. 4, the protrusion 212 has a height that corresponds to a thickness 222 of the printed circuit board. For example, if the thickness 222 of the printed circuit board is about one millimeter, the height of the protrusion 212 is also about one millimeter. As described above, other embodiments may include protrusions 212 that have a greater height than the thickness of the printed circuit board. Further, in other embodiments, the printed circuit board thickness 222 may be greater than or less than one millimeter.

The protrusion 212 may improve heat transfer from the surface mount device 214 to the heat sink 210. For example, the protrusion 212 may transfer heat more efficiently, provide a greater thermal conductivity than the printed circuit board material or thermal vias in the printed circuit board, etc.

In one example, if power dissipation in the surface mount device 214 is about 6 Watts, a temperature rise at the heat sink may be an ambient temperature plus about 23.39 degrees Celsius. If the ambient temperature is about 55 degrees Celsius, the resulting temperature at the heat sink 210 may be about 84.39 degrees Celsius.

In the example, a thermal resistance at the junction of the surface mount device 214 and the printed circuit board 202 may be about 0.9 K/W. A thermal resistance between the surface mount device 214 and the heat sink 210 may be about 1.1711 K/W when the heat sink 210 comprises copper, and about 3.02 K/W when the heat sink 210 comprises aluminum. Compared to embodiments that do not include a heat sink 210 having a protrusion 212, a copper heat sink 210 may improve heat dissipation by about 57 percent, and an aluminum heat sink 210 may improve heat dissipation by about 24 percent. The above example values are provided for purposes of illustration only. As should be apparent, other embodiments may have different thermal resistances, different temperatures, different heat sink materials, different improvement percentage factors, etc.

Figure 5:
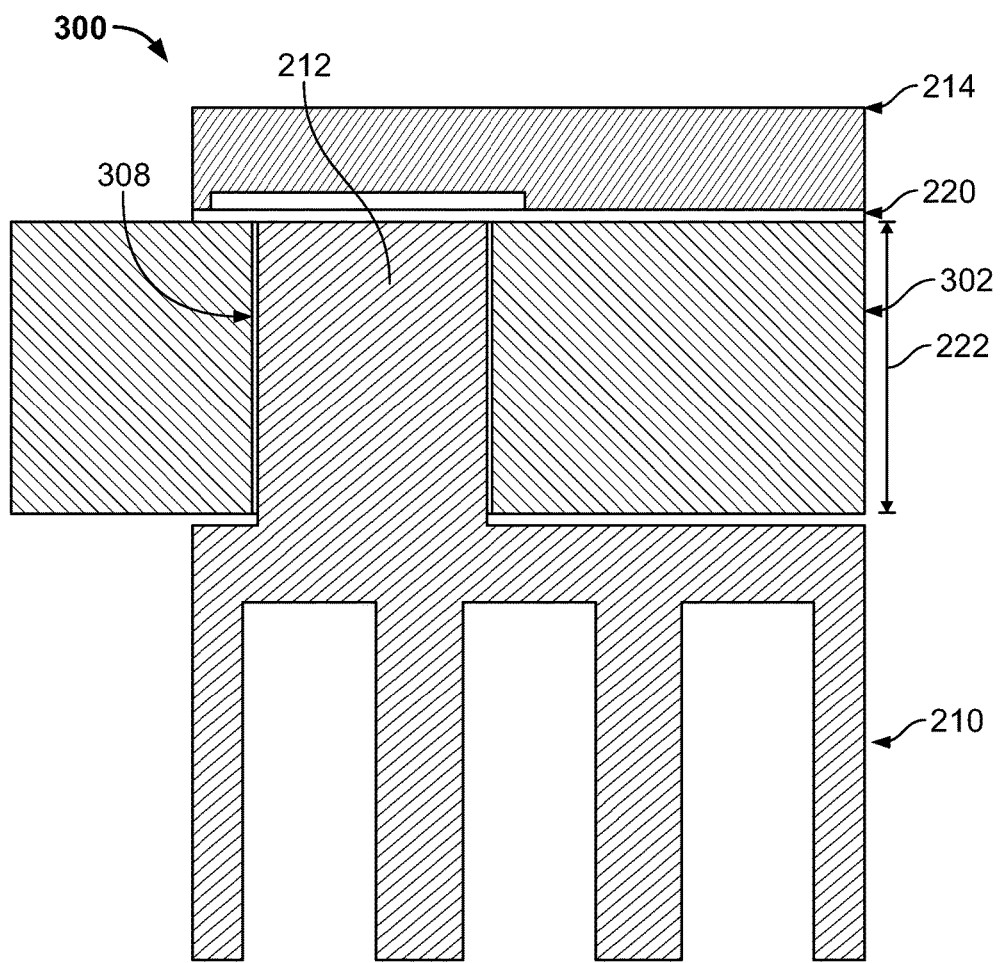
FIG. 5 is a side sectional view of another example heat sink assembly, having a printed circuit board that extends beyond the heat sink and the surface mount device.

FIG. 5 illustrates a heat sink assembly 300 according to another example embodiment of the present disclosure. Similar to the heat sink assembly 200 of FIG. 4, the heat sink assembly 300 includes a heat sink 210 having a protrusion 212 that extends through an opening 308 defined in a printed circuit board 302.

A surface mount device 214 is coupled to a top side of the printed circuit board 202 via a solder material 220. The surface mount device 214 is in thermal contact with the protrusion 212 of the heat sink 210 to dissipate heat from the surface mount device 214 to the heat sink 210. The protrusion 212 has a height that corresponds to a thickness 222 of the printed circuit board.

As shown in FIG. 5, the printed circuit board 302 extends beyond the surface mount device 214 and the heat sink 210. The printed circuit board 302 has a top surface having a greater surface area than the footprint of surface mount device 214 and a bottom surface having a greater surface are than the heat sink 210. Accordingly, the printed circuit board 302 may accommodate different package sizes of surface mount devices 214, different sizes of heat sinks 210, etc.

FIG. 5 illustrates the heat sink 210 as having a same surface area size as the footprint of surface mount device 214, and the protrusion 212 of the heat sink 210 having a smaller surface area size than the footprint of surface mount device 214. It should be apparent that in other embodiments, the heat sink 210 and/or the protrusion 212 may have a greater surface area than the footprint of surface mount device 214. This may allow for different package sizes of surface mount devices 214 to be coupled to the protrusion 212 of the heat sink.

For example, the protrusion 212 of the heat sink may have a surface area on a top surface of the protrusion 212 that is greater than the footprint of the largest package size surface mount device 214. This may increase the area of contact between the surface mount device 214 and the protrusion 212 for a range of package sizes of the surface mount devices 214, while reducing (or eliminating) the area of contact between the surface mount device 214 and the printed circuit board 302.

In another embodiment, a method of coupling a heat sink assembly to a surface mounted device is disclosed. The example method includes coupling a heat sink to a first side of a printed circuit board. The printed circuit board has an opening, and the protrusion is positioned in the opening. The opening is defined between the first side of the printed circuit board and a second side of the printed circuit board opposite the first side. The method also includes coupling a surface mount device to the second side of the printed circuit board and/or the protrusion to transfer heat from the surface mount device to the heat sink.

Coupling the heat sink may include applying one or more glue dots to the bottom side of the printed circuit board adjacent the opening, and contacting the heat sink to the one or more glue dots. For example, during manufacturing glue dots may be dispensed at substantially the same time that other surface mount devices on the bottom side of the printed circuit board are being attached. Solder paste may be stencil-printed on the bottom side of the printed circuit board for coupling the surface mount devices, although the heat sink may not require solder paste. Glue dots may then be dispensed at the heat sink coupling locations (e.g., adjacent the openings defined in the printed circuit board). All bottom side surface mount devices and the heat sinks may then be machine placed on the printed circuit board.

Coupling the heat sink may include placing the second side of the printed circuit board against a flat surface, and inserting the heat sink through the opening defined in the printed circuit board until the protrusion of the heat sink contacts the flat surface, such that the protrusion of the heat sink is coplanar with the second side of the printed circuit board. For example, the printed circuit board may be backed with a flat pallet such that both the top side of the printed circuit board and the protrusion of the heat sink stop at the same backing surface.

The method may include applying heat to the printed circuit board and the heat sink to set the one or more glue dots and secure the heat sink to the printed circuit board. For example, once the printed circuit board and protrusion are stopped at the same backing surface, the whole assembly may be passed through a reflow oven to set the glue and secure the heat sink in position.

Coupling the surface mount device to the printed circuit board may include applying solder to the protrusion of the heat sink, and contacting the heat sink to the solder. For example, the top side of the printed circuit board may be processed normally, because the heat sinks have become an integral part of the printed circuit board. Solder paste may be stencil-printed like normal, over pads of the printed circuit board and also over the protrusions of the heat sinks. The surface mount devices may then be placed on the printed circuit board and/or the protrusions and coupled via the solder paste.

Any of the example embodiments, aspects and/or features disclosed herein may be used in any suitable combination with any other example embodiments, aspects and/or features disclosed herein without departing from the scope of the present disclosure. For example, heat sink assemblies described herein may be coupled together using other methods, the coupling methods described herein may be implemented with other heat sinks, surface mounted devices, etc. without departing from the scope of the present disclosure.

The example heat sink assemblies described herein may be used in any suitable applications, including but not limited to alternating current (AC) to direct current (DC) power supplies, DC to DC power supplies, power converters where heat removal from surface mount devices is desirable, etc. For example, some heat sink assemblies may be used in high density, high wattage power supplies.

Example embodiments and aspects of the present disclosure may provide any of the following advantages: increasing thermal conductivity from a surface mount device to a heat sink (e.g., as compared to through vias of a printed circuit board, etc.), reducing heat sink cost due to a more efficient heat conduction path allowing for a smaller heat sink size, increasing heat sink efficiency in high density power converter designs, use of the heat sink as a high current capacity bus bar directly connected with the device to reduce electrical conduction loss (e.g., as compared to through vias of the printed circuit board, as compared to a circuit of the printed circuit board, etc.).

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A heat sink assembly comprising:
   a printed circuit board having a first side and a second side opposite the first side, the printed circuit board defining an opening extending from the first side of the printed circuit board to the second side of the printed circuit board;
   a heat sink coupled to the first side of the printed circuit board with glue, the heat sink including a protrusion including a top surface having a surface area, the protrusion of the heat sink extending through the opening defined in the printed circuit board with the top surface of the protrusion substantially coplanar with the second side of the printed circuit board, the protrusion having a height that is greater than a thickness of the printed circuit board; and
   a surface mount device coupled to the protrusion of the heat sink via solder, the surface mount device in thermal contact with the protrusion of the heat sink to transfer heat from the surface mount device to the heat sink, the surface mount device including a main body and at least one terminal extending from the main body, wherein the main body of the surface mount device and the top surface of the protrusion each have a length and a width, the length of the main body of the surface mount device is greater than the length of the top surface of the protrusion, and the width of the main body of the surface mount device is less than the width of the top surface of the protrusion.

2. The heat sink assembly of claim 1, wherein the opening defined in the printed circuit board is plated with a thermally conductive material.

3. The heat sink assembly of claim 1, wherein the glue includes a plurality of glue portions.

4. The heat sink assembly of claim 1, wherein the heat sink comprises copper.

5. The heat sink assembly of claim 1, wherein the heat sink comprises aluminum.

6. The heat sink assembly of claim 1, wherein the heat sink is a first heat sink, the opening is a first opening, the surface mount device is a first surface mount device, and the printed circuit board further defines a second opening extending from the first side of the printed circuit board to the second side of the printed circuit board, the heat sink assembly further comprising:
   a second heat sink coupled to the first side of the printed circuit board with the glue, the second heat sink including a second protrusion including a second top surface having a second surface area, the second protrusion of the second heat sink extending through the second opening with the second top surface of the second protrusion of the second heat sink substantially coplanar with the second side of the printed circuit board; and
   a second surface mount device coupled to the second protrusion of the second heat sink via the solder, the second surface mount device in thermal contact with the second protrusion of the second heat sink to transfer heat from the second surface mount device to the second heat sink, the second surface mount device including a second main body and at least one second terminal extending from the second main body, wherein the second main body of the second surface mount device and the second top surface of the second protrusion of the second heat sink each have a second length and a second width, the second length of second main body of the second surface mount device is greater than the second length of the second top surface of the second protrusion of the second heat sink, and the second width of the second main body of the second surface mount device is less than the second width of the second top surface of the second protrusion of the second heat sink.

7. The heat sink assembly of claim 1, further comprising a circuit disposed on the second side of the printed circuit board, wherein the surface mount device includes the at least one terminal electrically coupled to the circuit.

8. The heat sink assembly of claim 1, wherein the heat sink includes multiple fins extending away from the first side of the printed circuit board.

9. A method of manufacturing a heat sink assembly, the method comprising:
   coupling a heat sink having a protrusion to a first side of a printed circuit board with glue, the printed circuit board having an opening, the protrusion positioned in the opening, the opening defined between the first side of the printed circuit board and a second side of the printed circuit board opposite the first side, the protrusion having a height that is greater than a thickness of the printed circuit board with a top surface of the protrusion substantially coplanar with the second side of the printed circuit board, and the top surface of the protrusion having a surface area; and
   coupling a surface mount device to the protrusion of the heat sink via solder, to transfer heat from the surface mount device to the heat sink, the surface mount device including a main body and at least one terminal extending from the main body, wherein the main body of the surface mount device and the top surface of the protrusion each have a length and a width, the length of the main body of the surface mount device is greater than the length of the top surface of the protrusion, and the width of the main body of the surface mount device is less than the width of the top surface of the protrusion.

10. The method of claim 9, wherein the glue includes one or more glue dots, and the coupling of the heat sink to the first side of the printed circuit board includes applying the one or more glue dots to the first side of the printed circuit board adjacent the opening and contacting the heat sink to the one or more glue dots.

11. The method of claim 10, wherein the coupling of the heat sink includes placing the second side of the printed circuit board against a flat surface, and inserting the heat sink through the opening defined in the printed circuit board until the protrusion of the heat sink contacts the flat surface to align that the protrusion of the heat sink coplanar with the second side of the printed circuit board.

12. The method of claim 11, further comprising heat curing the printed circuit board and the heat sink to set the one or more glue dots and secure the heat sink to the printed circuit board.

13. The method of claim 8, wherein the coupling of the surface mount device to the protrusion of the heat sink includes applying the solder to the protrusion of the heat sink, and contacting the surface mount device to the solder.

* * * * *

UNITED STATES PATENT AND TRADEMARK OFFICE
CERTIFICATE OF CORRECTION

PATENT NO. : 10,504,813 B2  
APPLICATION NO. : 15/282540  
DATED : December 10, 2019  
INVENTOR(S) : Rahul Vinaykumar Davare, Robert Henry Kippley and Kwong Kei Chin Page 1 of 1

It is certified that error appears in the above-identified patent and that said Letters Patent is hereby corrected as shown below:

In the Specification

At Column 2, Line 2, please replace "FIG." with "FIG. 1.";

At Column 3, Line 48, please replace "106" with "104";

At Column 3, Line 64, please replace "115" with "114";

At Column 4, Line 33, please replace "102" with "108"; and

In the Claims

At Column 10, Line 61, please replace "claim 8" with "claim 9".

Signed and Sealed this  
Seventh Day of April, 2020

Andrei Iancu  
*Director of the United States Patent and Trademark Office*